United States Patent [19]

Gardner et al.

[11] Patent Number: 6,008,096
[45] Date of Patent: Dec. 28, 1999

[54] ULTRA SHORT TRANSISTOR FABRICATION METHOD

[75] Inventors: Mark I. Gardner, Cedar Creek; Michael Duane; Daniel Kadosh, both of Austin, all of Tex.

[73] Assignee: Advanced Micro Devices, Inc., Sunnyvale, Calif.

[21] Appl. No.: 08/790,516

[22] Filed: Jan. 29, 1997

[51] Int. Cl.$^6$ .................................................. H01L 21/336
[52] U.S. Cl. .......................... 438/300; 438/279; 438/303; 438/532; 438/585
[58] Field of Search ...................... 438/300, 299, 438/301, 305, 306, 307, 231, 232, 199, 564, 229, 589, 532, 279, 303, 585

[56] References Cited

U.S. PATENT DOCUMENTS

| | | | |
|---|---|---|---|
| 4,419,809 | 12/1983 | Riseman et al. | 438/231 |
| 4,597,827 | 7/1986 | Nishitani et al. | 438/227 |
| 4,992,388 | 2/1991 | Pfiester | 438/303 |
| 5,162,245 | 11/1992 | Favreau | 438/564 |
| 5,270,249 | 12/1993 | Fukuma | 438/301 |
| 5,342,796 | 8/1994 | Ahn et al. | 438/301 |
| 5,391,510 | 2/1995 | Hsu et al. | 438/301 |
| 5,436,178 | 7/1995 | Kimura | 438/305 |
| 5,466,615 | 11/1995 | Tsai | 438/303 |
| 5,583,064 | 12/1996 | Lee et al. | 438/307 |
| 5,654,215 | 8/1997 | Gardner et al. | 438/305 |

*Primary Examiner*—Michael Trinh
*Attorney, Agent, or Firm*—Kevin L. Daffer; Conley, Rose & Tayon

[57] ABSTRACT

A semiconductor process in which the transistor channel is defined by opposing sidewalls of a pair of masking structures formed on an upper surface of a semiconductor substrate. The spacing between the opposed sidewalls is defined by the thickness of the spacer structure formed between the sidewalls. The thickness of the spacer structure is preferably in the range of approximately 0.04 microns. A masking layer is formed on an upper surface of a semiconductor substrate. The masking layer includes first and second masking structures and a channel trench material. Opposing sidewalls of the first and second masking structures are laterally displaced by a channel displacement. The opposing sidewalls together with an upper surface of the semiconductor substrate define a channel trench. The channel trench is displaced above and aligned with a channel region of the semiconductor substrate. The channel trench material fills the channel trench. A mean projected path characteristic of the channel trench material is less than a mean projected path characteristic of the first and second masking structures. A source/drain impurity distribution is implanted into and through the masking layer to selectively introduce a source/drain impurity distribution into a source/drain region of the semiconductor substrate. The source/drain regions of the semiconductor substrate are laterally displaced on either side of the channel region. The channel trench material is then removed and a gate dielectric layer is formed on the floor of the channel trench. Thereafter, the channel trench is filled with a conductive material to form a conductive gate on the gate dielectric.

13 Claims, 2 Drawing Sheets

ULTRA SHORT TRANSISTOR FABRICATION METHOD

BACKGROUND OF THE INVENTION

1. Field of the Invention

This invention relates to the field of semiconductor processing and, more particularly, to a method of forming a transistor with a critical dimension less than the minimum resolvable feature size of conventional photolithography exposure equipment device.

2. Description of the Relevant Art

An integrated circuit includes a large number of transistors formed within a monolithic semiconductor substrate. Isolation structures such as field oxides or shallow trench dielectrics are used to electrically isolate individual transistors which are thereafter selectively coupled to other transistors through a series of interconnects and contacts to achieve a desired function. The operating characteristics of a transistor fabricated with metal-oxide-semiconductor (MOS) integrated circuit techniques are a function of the transistor's dimensions. In particular, the drain current ($I_{ds}$) is proportional to the ratio of the transistor's channel width (W) to the transistor's channel length (L) over a wide range of operating conditions. For a given transistor width and a given biasing condition (e.g., $V_G$=3V, $V_D$=3V, and $V_s$=0V), $I_{ds}$ is maximized by minimizing the channel length L. Minimizing channel length also improves the speed of integrated circuits comprised of a large number of individual transistors because the larger drain currents characteristic of short channel devices can quickly drive the adjoining transistors into saturation. Minimizing L is, therefore, desirable from a device operation standpoint. In addition, minimizing the transistor length L is desirable because a smaller area of silicon is required to manufacture a transistor having a smaller length. By minimizing the area required for a given transistor, the number of transistors available for a given area of silicon increases and with it, a corresponding increase in the circuit complexity that can be achieved on the given area of silicon. Moreover, smaller transistors result in smaller die sizes. Smaller die sizes are desirable from a manufacturing perspective because they increase the number of devices that can be fabricated on a single silicon wafer and decrease the probability that any individual die is rendered inoperable during the fabrication process by randomly occurring defects that are caused by contaminating particles present in every fabrication facility.

The main limitation on minimum feature size in most semiconductor processes is the resolution of the optical lithography printing system. In an optical lithography printing system, radiation is directed from an illumination source through a patterned mask and onto a photoresist layer. The patterned mask transmits the illumination source radiation onto selected areas of the photoresist layer to reproduce the mask pattern in the photoresist layer. Resolution in optical lithography systems is limited by diffraction effects, which spread radiation from the illumination source into regions of the photoresist which are not directly exposed to the illumination source. Because of diffraction effects, there is a minimum distance beyond which even a geometrically perfect lens cannot resolve two points. In other words, when two points are less than a minimum distance from each other, the two points cannot be resolved by the lithography system because the diffraction patterns associated with each point overlap each other to such an extent that the two points cannot be effectively differentiated. The resolution of a lens depends on the wavelength of the illumination source and the numerical aperture of the lens. Rayleighs criteria defines two images as being resolvable when the intensity between them drops to 80% of the image intensity. This criteria is satisfied when the $2d = 0.61\lambda/NA$. Where $2d$ is the separation distance of two images, $\lambda$ is the wavelength of the energy source, and NA is the numerical aperture of the lens. It is seen that, for a given lens, the minimum feature size varies directly with wavelength of illumination source.

Commercially available optical photolithography machines are typically equipped with mercury vapor lamps as the illumination source. The characteristic energy spectrum of a mercury vapor lamp contains several distinct peaks in the 300 nm to 450 nm wavelength range. These peaks are commonly referred to by their industry designations. The peak associated with a wavelength of ~450 nm is designated the "G-line," the ~405 nm peak the "H-line," and the ~365 nm peak the "I-line." Photolithography aligners are similarly designated such that it is common to speak of "G-line aligners" and "I-line aligners." The minimum feature size resolvable by an I-line aligner is smaller than the minimum feature size resolvable by a G-line aligner because of the shorter I-line wavelength. "Deep UV" optical aligners utilize energy having wavelengths of ~248 nm and ~193 nm to achieve still better resolution than is achievable with I-line aligners.

As process technologies approach and surpass the conventional limits of optical aligners, semiconductor manufacturers are forced to implement alternative techniques to achieve adequate resolution of the minimum features. Unfortunately, the alternatives typically involve abandoning or substantially modifying the existing photolithography equipment at a prohibitive cost. Many wafer fabrication facilities, for example, have extensive capital investment in I-line and deep UV aligners, which are capable of resolving features down to a minimum dimension of approximately 0.3 to 0.4 microns. To achieve adequate resolution of even smaller features, it is typically necessary to abandon the optical alignment equipment entirely and replace it with advanced lithography equipment including e-beam or x-ray lithography. The enormous cost associated with upgrading or replacing optical alignment photolithography equipment can be prohibitive. In addition to the capital required to purchase and install the improved equipment, there are extensive additional costs associated with qualifying the new equipment for production worthiness and training production and maintenance personnel in the operation and care of the new equipment. Therefore, it is highly desirable to implement a manufacturing process that can extend the useful life of existing photolithography equipment by permitting the reproducible fabrication of transistors having critical dimensions that are smaller than the minimum resolvable feature of the photolithography equipment.

SUMMARY OF THE INVENTION

The problems identified above are in large part addressed by a semiconductor process in which the transistor channel is defined by opposing sidewalls of a pair of masking structures formed on an upper surface of a semiconductor substrate. The spacing between the opposed sidewalls is defined by the thickness of the spacer structure formed between the sidewalls. Because the thickness of the spacer structure can be accurately controlled to a thickness in the range of approximately 0.04 microns, the channel length of the transistor can be accurately defined at dimensions well below the minimum feature size resolvable by conventional photolithography equipment.

Broadly speaking, the present invention contemplates a semiconductor process in which a masking layer is formed on an upper surface of a semiconductor substrate. The masking layer includes first and second masking structures and a channel trench material. Opposing sidewalls of the first and second masking structures are laterally displaced by a channel displacement. The opposing sidewalls together with an upper surface of the semiconductor substrate define a channel trench. The channel trench is displaced above and aligned with a channel region of the semiconductor substrate. The channel trench material fills the channel trench. A mean projected path characteristic of the channel trench material is less than a mean projected path characteristic of the first and second masking structures. After the formation of the masking layer, a source/drain impurity distribution is implanted into and through the masking layer to introduce a source/drain impurity distribution into a source/drain region of the semiconductor substrate. The source/drain regions of the semiconductor substrate are laterally displaced on either side of the channel region. The channel trench material is then removed and a gate dielectric layer is formed on the floor of the channel trench. Thereafter, the channel trench is filled with a conductive material to form a conductive gate on the gate dielectric.

The semiconductor substrate preferably comprises a p-type epitaxial layer formed on a p+ silicon bulk. A preferred resistivity of the p-type epitaxial layer is in the range of approximately 10 to 15 $\Omega$-cm. In one embodiment, the first and second masking structure are formed on an upper surface of a thin pad dielectric layer. The first and second masking structures are made of polysilicon in one embodiment. Preferably, a resistivity of the polysilicon is greater than approximately $1\times10^4$ $\Omega$-cm. The formation of the masking layer preferably includes the steps of depositing a first thin film layer on an upper surface of the semiconductor substrate, patterning the first thin film layer to form the first masking structure, forming a spacer structure on the sidewall of the first masking structure, depositing a second thin film layer, and patterning the second thin film layer to form the second masking structure. The patterning of the first thin film layer is accomplished such that a sidewall of the first masking structure is aligned over a channel first boundary of the semiconductor substrate. The thickness of the spacer structure is approximately equal to the channel displacement. A sidewall of the second masking structure contacts an exposed sidewall of the spacer structure such that the sidewall of the second masking structure is aligned over a channel second boundary of the semiconductor substrate. The channel first boundary is laterally displaced from the channel second boundary by the channel displacement. The spacer structure is preferably comprised of a deposited oxide. In a presently preferred embodiment, the channel displacement is less than approximately 0.10 microns and still more preferably it is in the range of approximately 0.03 to 0.05 microns. In one embodiment, the implanting of the source/drain impurity distribution follows the steps of filling the channel trench with the conductive material.

The present invention further contemplates a semiconductor transistor. The transistor includes a semiconductor substrate, first and second thin film structures formed on an upper surface of the semiconductor substrate, a gate dielectric formed between opposing sidewalls of the first and second thin film structures, a conductive gate structure formed between the first and second thin film structures, and a pair of source/drain structures. The first and second thin film structures include opposing sidewalls that are laterally displaced from each other by a channel displacement. The gate dielectric, which resides between the opposing sidewalls, is aligned over a channel region of the semiconductor substrate. The source/drain structures, each comprise a source/drain impurity distribution substantially contained within a pair of source/drain regions that are laterally displaced on either side of the channel region of the semiconductor substrate.

In the presently preferred embodiment, the first and second thin film structures comprise polysilicon and the channel displacement is, less than approximately 0.10 microns. Still more preferably, the channel displacement is in the range of approximately 0.03 to 0.05 microns. In one embodiment, the first and second thin film structures are formed on a thin pad oxide located on the semiconductor substrate upper surface. The preferred gate dielectric comprises a thermally grown oxide and the conductive gate structure is preferably a metal such as aluminum, copper, tungsten, titanium, or appropriate alloys thereof.

The present invention still further contemplates a semiconductor process in which a semiconductor substrate is provided. Polysilicon is then deposited on an upper surface of the semiconductor substrate and the polysilicon is patterned to form the first polysilicon structure. A sidewall of the first polysilicon structure is aligned over a channel first boundary of the semiconductor substrate. The spacer structure is then formed on the sidewall of the first polysilicon structure. The spacer extends laterally a channel displacement from the sidewall of the first polysilicon structure. A second polysilicon structure is then formed on the semiconductor substrate upper surface. A sidewall of the second polysilicon structure contacts an exposed sidewall of the spacer structure and is aligned over a channel second boundary of the semiconductor substrate. The channel first boundary and the channel second boundary are laterally displaced from each other by the channel displacement. The first polysilicon structure, the spacer structure and the second polysilicon structure comprise a masking layer. A source/drain impurity species is then implanted into the masking layer to produce a source/drain impurity distribution formed within a pair of source/drain regions laterally displaced on either side of the channel region of the semiconductor substrate. The spacer structure is then removed and a gate dielectric is grown on an upper surface of the semiconductor substrate between the first and second polysilicon structures. The gate dielectric is aligned over the channel region of the semiconductor substrate. Thereafter, a conductive gate material is deposited on the gate dielectric to form a conductive gate structure between the first and second polysilicon structure. In the preferred embodiment, the spacer structure comprises a deposited oxide and the channel displacement is less than approximately 0.10 microns and still more preferably is in the range of approximately 0.03 to 0.05 microns.

BRIEF DESCRIPTION OF THE DRAWINGS

Other objects and advantages of the invention will become apparent upon reading the following detailed description and upon reference to the accompanying drawings in which.

Figure 1:
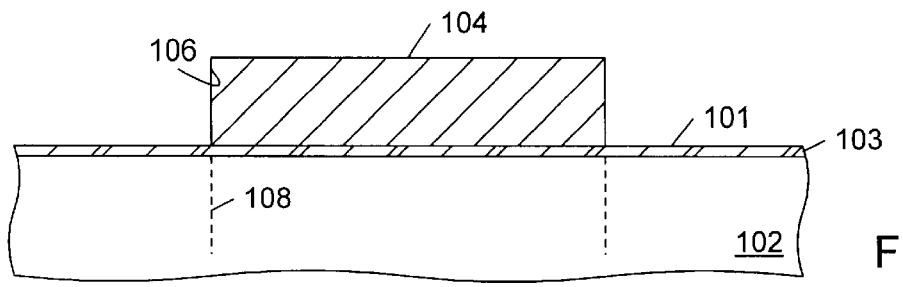
FIG. 1 is a partial cross-sectional view of a semiconductor substrate upon which a first thin film structure has been formed.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents, and alternatives falling within the spirit and scope of the present invention as defined by the appended claims.

DETAILED DESCRIPTION OF THE DRAWINGS

Turning now to the drawings, FIGS. 1 through 7 show processing sequences for forming semiconductor transistors according to the present invention. FIGS. 1 through 4 show a presently preferred sequence for forming a masking layer 124 (shown in FIG. 4) on upper surface 101 of a semiconductor substrate 102. The starting material for semiconductor substrate 102 is preferably a monocrystalline silicon substrate. In a presently preferred embodiment, semiconductor substrate 102 includes a p-type epitaxial layer formed on a p+ silicon bulk. The epitaxial layer preferably has a resistivity in the range of 10 to 15 Ω-cm.

A first thin film layer is deposited on upper surface 101 of semiconductor substrate 102. The first thin film layer is then patterned to form first masking structure 104. First masking structure 104 includes a sidewall 106 aligned over a channel first boundary 108 of semiconductor substrate 102. A suitable material for a presently preferred embodiment of the first thin film layer is chemically vapor deposited polysilicon. In this embodiment, polysilicon is deposited on upper surface 101 of semiconductor substrate 102 by thermally decomposing silane at a temperature in the range of approximately 500° C. to 680° C. as is well known to those skilled in the art of semiconductor processing. The patterning of first thin film layer 104 is accomplished through the use of conventional photolithography and etch techniques. In one embodiment, semiconductor substrate 102 includes pad oxide 103 at its upper surface. Pad oxide 103 can serve as an etch stop for the patterning of the first thin film layer and provides electrical insulation between first masking structure 104 and semiconductor substrate 102. Preferably, pad oxide 103 comprises a native oxide film or an oxide grown at a temperature less than approximately 800° C. Pad oxide 103, when used, is preferably less than 30 angstroms in thickness.

Figure 2:
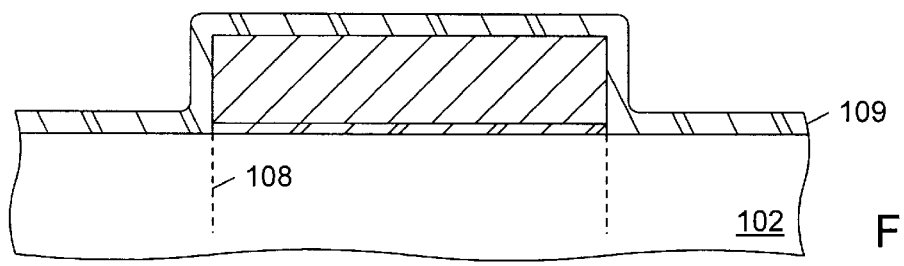
FIG. 2 is a processing step subsequent to FIG. 1 in which a layer of spacer material has been deposited upon the semiconductor substrate and the thin film structure.
Figure 3:
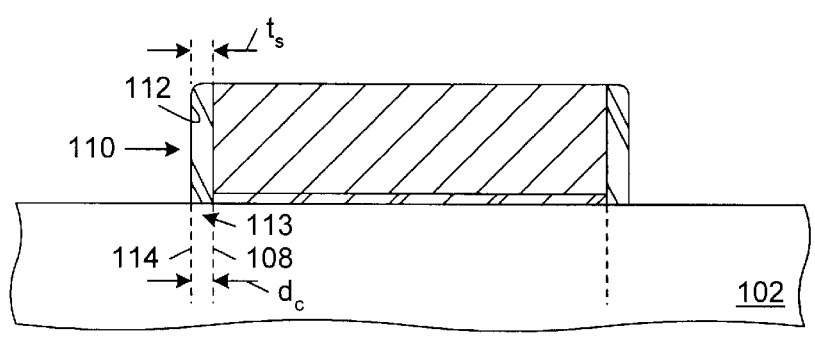
FIG. 3 is a processing step subsequent to FIG. 2 in which the spacer layer has been etched to produce spacer structures on the sidewalls of the first thin film structure.

Turning now to FIG. 2, spacer material 109 is deposited upon first masking structure 104 and upper surface 101 of semiconductor substrate 102. In one embodiment, spacer material 109 is a CVD oxide formed at low pressure (i.e., pressure less than approximately two torrs) using a TEOS source. Low pressure CVD oxide deposition is well known and frequently used to provide a high quality and highly conformal dielectric film upon an underlying topography. Film thicknesses of less than 500 angstroms can be reliably produced using CVD techniques and thickness variation can be controlled to within approximately 10 angstroms. Turning to FIG. 3, a spacer etch is performed upon spacer material 109 to produce spacer structure 110. A thickness $t_s$ of spacer structure 110 is approximately equal to a channel displacement $d_c$ of channel region 113 of semiconductor substrate 102. Formation of spacer structures such as spacer structure 112 upon sidewall 106 of first spacer structure 104 is typically accomplished with an anisotropic dry etch process using an etch cycle which includes only a minimal overetch. The spacer etch is designed to remove portions of an underlying film located in planar regions (i.e., regions of the underlying topography that are substantially in parallel with upper surface 101 of semiconductor substrate 102). Because the thickness $t_s$ of spacer structure 110 is approximately equal to a channel displacement $d_c$ within semiconductor substrate 102, exposed surface 112 of spacer structure 110 is aligned over a channel second boundary 114 of semiconductor substrate 102. In the presently preferred embodiment, a thickness $t_s$ of spacer structure 110 is less than approximately 0.10 microns and is still more preferably in the range of approximately 0.03 to 0.05 microns.

Figure 4:
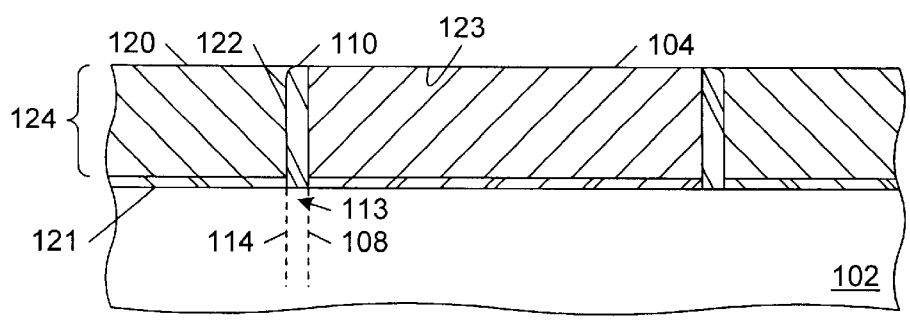
FIG. 4 is a processing step subsequent to FIG. 3 in which a second thin film structure has been formed in contact with an exposed sidewall of the spacer structure to produce a masking layer on the semiconductor substrate.

Turning to FIG. 4 a second masking structure 120 has been formed such that sidewall 122 of second masking structure 120 is in contact with exposed sidewall 112 and spacer structure 110. Second spacer structure 120 may be formed by depositing a second thin film layer on the semiconductor topography and thereafter planarizing the second thin film layer through the use of conventional planarization techniques such as chemical mechanical polishing possibly in combination with photolithography mask and etch steps to produce a substantially planar upper surface 123 of masking layer 124. Masking layer 124 includes first masking structure 104, second masking structure 120, and spacer structure 110 where spacer structure 110 serves as the channel trench material. Sidewall 122 of spacer structure 120 is aligned over a channel second boundary 114 of channel region 113 of semiconductor substrate 102. Similar to first spacer structure 104, second spacer structure 120 may reside upon a thin pad oxide shown in FIG. 4 as second pad oxide 121. Like first pad oxide 103, second pad oxide 121 may be a made of a native oxide film or an oxide film grown at a temperature ideally less than 800° C. Second pad oxide 121 preferably has a thickness less than or equal to approximately 30 angstroms.

Figure 5:
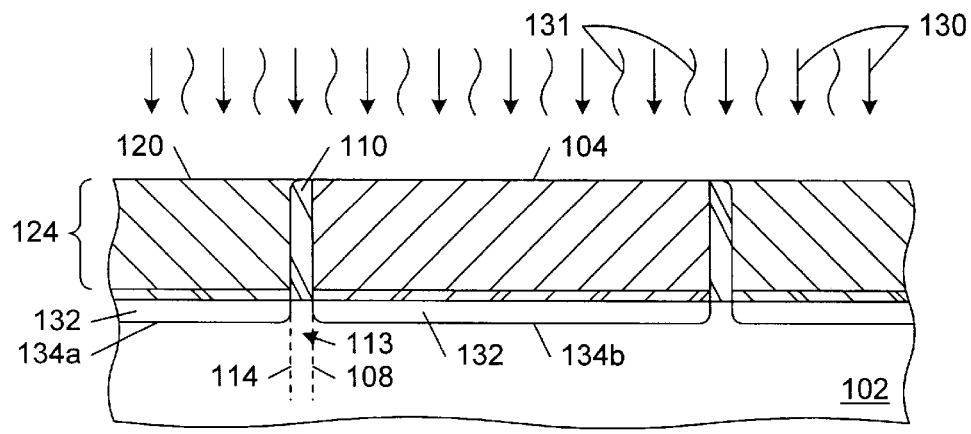
FIG. 5 is a processing step subsequent to FIG. 4 in which an impurity distribution is introduced into source/drain regions of the semiconductor substrate through the masking layer.
Figure 6:
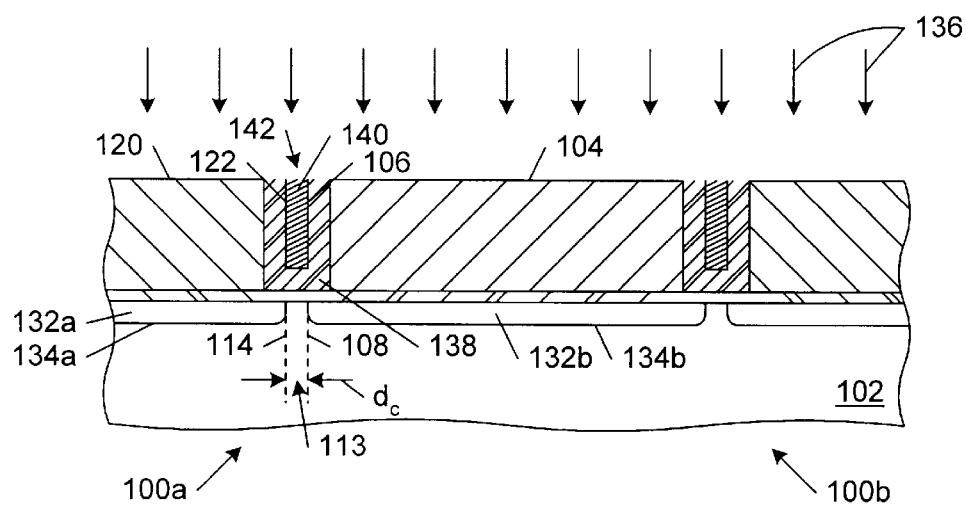
FIG. 6 is a processing step subsequent to FIG. 5 in which a gate dielectric and a conductive gate structure have been formed between opposing sidewalls of the first and second thin film structures; and, FIG. 7 is a processing step subsequent to FIG. 6 in which an isolation structure has been formed between first and second transistors manufactured according to the present invention.

FIGS. 5 and 6 show alternative embodiments for forming source/drain structures in the semiconductor substrate. In FIG. 5, ion implantation 130 is performed to introduce a source/drain impurity distribution 132 into a pair of source/drain regions 134a and 134b within semiconductor substrate 102. Selective masking is provided by the different material comprising masking layer 124 such that the source/drain impurity distribution 132 resides substantially within the source/drain regions 134 and is substantially nonexistent in channel region 113 of semiconductor substrate 102. Masking layer 124 produces this selective masking function because the implant characteristics of spacer structure 110 are different than the implant characteristics of first and second masking structures 104 and 120, respectively. More specifically, masking layer 124 is preferably fabricated such that the portion of masking layer 124 aligned over channel region 113 provides an effective blocking structure for implant 130 while the remainder of masking layer 124 permits penetration of ion implantation 130 through masking layer 124 into source/drain regions 134 of semiconductor substrate 102. In alternative embodiments, source/drain impurity distribution 132 may be introduced into semiconductor substrate 102 during implant 130 (shown in FIG. 5) prior to the removal of spacer structure 110 or, with implant 136 (shown in FIG. 6) after the formation of the gate dielectric and a conductive gate structure as described in greater detail below. Returning to FIG. 5, masking layer 124, in a presently preferred embodiment, comprises polysilicon masking structures 104 and 120 and an oxide spacer structure 110. Because the projected range $R_p$ of impurities implanted into polysilicon is greater than the projected range of impurities injected through oxide film, the implant energy of ion implantation 130 may be adjusted such that impurities penetrate polysilicon regions of masking layer 124 while they are unable to penetrate the regions of masking layer 124 that are comprised of oxide. By aligning spacer structure 110 over channel region 113 of semiconductor substrate 102, masking layer 124 provides an effective means for selectively introducing ion implantation 130 into desired regions of semiconductor substrate 102. In a presently preferred embodiment, ion implantation 130 is suitably performed at an implant energy of approximately 10 to 100 keV using an implant dose in the range of approximately $1\times10^{12}$ to $1\times10^{15}$ atoms/cm$^2$. As is well known in the field of semiconductor processing, preferred species for source/drain ion implantations such as ion implantation 130 include phosphorous and arsenic for n+ impurity distributions and boron for p+ impurity distributions.

Turning now to FIG. 6, spacer structure 110 has been removed from between sidewalls 106 and 122 of masking structures 104 and 120 respectively. In embodiments of the present invention in which spacer 110 comprises an oxide such as chemically vapor deposited TEOS, removal of spacer structure 110 is preferably achieved with a 10:1 HF solution. After the removal of spacer structure 110, trench gate dielectric 138 is formed on the floor of a trench defined by sidewall 106, sidewall 122, and the portion of upper surface 101 of semiconductor substrate 102 between channel first boundary 108 and channel second boundary 114. Trench gate dielectric 138 is preferably formed with a thermal oxidation process. Thereafter, a conductive material such as aluminum, copper, tungsten, or an alloy thereof is deposited between sidewall 106 and sidewall 122 to form trench gate structure 140 on an upper surface of trench gate dielectric 138. As shown in FIG. 6, portions of the conductive material used to form trench gate structure 140, exterior to the trench between sidewall 106 and sidewall 122 have been removed, preferably through the use of a chemical mechanical polish. In an embodiment of the present invention, in which ion implantation 130 is omitted, formation of the source/drain structures is accomplished with ion implantation 136 after the formation of trench gate dielectric 138 and trench gate structure 140. Except for its position within the process flow, ion implantation 136 is similar in all other respects to ion implantation 130 and serves to introduce an impurity distribution 132 into source/drain regions 134 of semiconductor substrate 102 where the source/drain regions 134a and 134b are laterally displaced on either side of a channel region 113 of semiconductor substrate 102. It will be understood by those skilled in the art of semiconductor processing that either ion implantation 130 shown in FIG. 5 or ion implantation 136 shown in FIG.6 is sufficient to form the transistor source/drain structures and that both implantation steps are unnecessary. The ability to implant the source/drain structures at two or more points in the process flow adds flexibility to the process. In some applications, it may be desired to introduce the source/drain impurities into semiconductor substrate 102 after the thermal oxidation process preferably used to form trench gate dielectric 138 thereby minimizing the redistribution of the source/drain impurity distributions 132 within the semiconductor substrate 102. In other applications, it may be desirable to implant prior to the formation of trench gate dielectric 138 to minimize the implant damage to the transistor gate dielectric.

Figure 7:
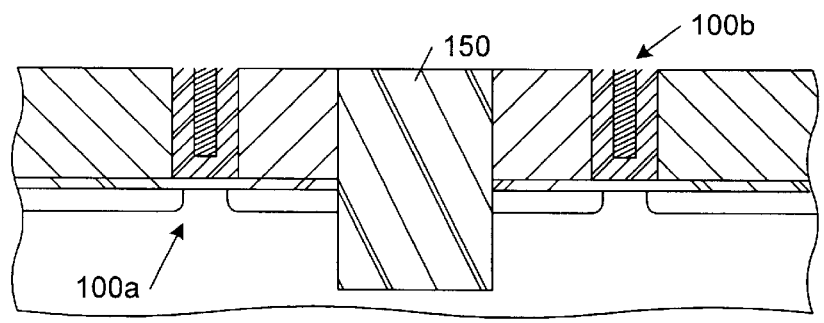

It will be appreciated that FIGS. 1 through 6 exhibit a symmetry wherein an identical structure to the structure described in detail has been fabricated on a distal sidewall of first masking structure 104. These symmetrical transistors 100a and 100b share a common source/drain region 134b therebetween. First transistor 100a includes semiconductor substrate 102, first and second thin film structures 104 and 120 respectively, trench gate dielectric 138, trench gate structure 140, and a pair of source/drain structures 132a and 132b. First and second thin film structures 104 and 120 include opposing sidewalls 106 and 122. Opposing sidewalls 106 and 122 are laterally displaced by a channel displacement $d_c$. Trench gate dielectric 138 is formed between the opposing sidewalls 106 and 122 on upper surface 101 of semiconductor substrate 102. Trench gate dielectric 138 is aligned over channel region 113 of semiconductor substrate 102. Similarly, conductive gate structure 140 is formed between sidewalls 106 and 122 of first masking structure 104 and second masking structure 120 respectively. Source/drain structures 132a and 132b are laterally displaced on either side of channel region 113 of semiconductor substrate 102. As discussed previously, preferred embodiments of first transistor 100 include a thermal oxide trench gate dielectric 138, a metal or polysilicon conductive gate structure 140, and a channel displacement $d_c$ that is less than approximately 0.10 microns and still more preferably in the range of approximately 0.03 to 0.05 microns. Turning to FIG. 7, if it is desired to electrically isolate first transistor 100a from second transistor 100b, a transistor isolation structure 150 may be formed between the pair of transistors. Suitable material for isolation trench 150 include oxide and or silicon nitride. The isolation of first transistor 100a from second transistor 100b results in an integrated circuit 200 in which integrated circuit 100 includes first transistor 100a, second transistor 100b, and isolation structure 150 therebetween.

It will, therefore, be appreciated to those skilled in the art having the benefit of this disclosure that this invention is capable of producing transistors having critical dimensions that are smaller than the minimum feature resolvable by optical photolithography equipment. Furthermore, it is to be understood that the form of the invention shown and described is to be taken as presently preferred embodiments. Various modifications and changes may be made to each and every processing step as would be obvious to a person skilled in the art having the benefit of this disclosure. It is intended that the following claims be interpreted to embrace all such modifications and changes and, accordingly, the specification and drawings are to be regarded in an illustrative rather than a restrictive sense.

What is claimed is:

1. A semiconductor process, comprising:

providing a semiconductor substrate;

depositing a first thin film layer on an upper surface of said semiconductor substrate;

patterning said first thin film layer to form a first masking structure comprising a sidewall;

forming a spacer structure on said sidewall of said first masking structure, wherein said spacer structure is formed from a spacer material having a mean projected path characteristic smaller than a mean projected path characteristic of said first masking structure;

depositing a second thin film layer;

patterning the second thin film layer to form a second masking structure, wherein a sidewall of said second masking structure contacts an exposed sidewall of said spacer structure such that opposing sidewalls of said first and second masking structures are laterally displaced by a channel displacement, and wherein the opposing sidewalls, together with an upper surface of said semiconductor substrate, cooperatively define a channel trench displaced above and aligned with a channel region of said semiconductor substrate, and wherein said spacer structure comprises a channel trench material filling said channel trench, and further wherein said first masking structure, second masking structure and channel trench material combine to form a masking layer upon said semiconductor substrate;

implanting source and drain impurities through said masking layer and into said semiconductor substrate to form a pair of source and drain impurity distributions within a pair of source and drain regions of said semiconductor substrate, wherein said source and drain regions of said semiconductor substrate are laterally displaced on either side of said channel region;

removing said channel trench material;

forming a gate dielectric on a floor of said channel trench; and filling said channel trench with a conductive material to form a conductive gate on said gate dielectric.

2. The process of claim 1, wherein said semiconductor substrate comprises a p-type epitaxial layer formed on a p+ silicon bulk, wherein a resistivity of said p-type epitaxial layer is in the range of approximately 10 to 15 $\Omega$-cm.

3. The process of claim 1, wherein said first and second masking structures comprise polysilicon.

4. The process of claim 3, wherein a resistivity of said polysilicon is greater than approximately $10^4$ $\Omega$-cm.

5. The process of claim 1, wherein said first thin film layer and said second thin film layer comprise polysilicon.

6. The process of claim 1, wherein said spacer structure comprises a deposited oxide.

7. The process of claim 1, wherein said channel displacement is less than approximately 0.10 microns.

8. The process of claim 7, wherein said channel displacement is in the range of approximately 0.03 to 0.05 microns.

9. The process of claim 1, wherein the step of implanting source and drain impurities follows the step of filling said channel trench.

10. A semiconductor process, comprising:

providing a semiconductor substrate;

depositing polysilicon on an upper surface of said semiconductor substrate and patterning said polysilicon to form a first polysilicon structure, wherein a sidewall of said first polysilicon structure is aligned over a channel first boundary of said semiconductor substrate;

forming a spacer structure on said sidewall of said first polysilicon structure, wherein said spacer structure extends laterally a channel displacement from said sidewall of the first polysilicon structure;

forming a second polysilicon structure on said upper surface of said semiconductor substrate, wherein a sidewall of said second polysilicon structure contacts an exposed sidewall of said spacer structure, and further wherein said sidewall of said second polysilicon structure is aligned over a channel second boundary of said semiconductor substrate, wherein said channel first boundary and said channel second boundary are laterally displaced said channel displacement, and wherein said first polysilicon structure, said spacer structure and said second polysilicon structure comprise a masking layer;

implanting source and drain impurity species through said masking layer and into said semiconductor substrate, wherein source and drain impurity distributions are formed within a pair of source and drain regions laterally displaced on either side of said channel region of said semiconductor substrate;

removing said spacer structure;

growing a gate dielectric on said upper surface of said semiconductor substrate between said first and second polysilicon structures, wherein said gate dielectric is aligned over said channel region of said semiconductor substrate; and depositing a conductive gate material on said gate dielectric to form a conductive gate structure between said first and second polysilicon structures.

11. The process of claim 10, wherein said spacer structure comprises a deposited oxide.

12. The process of claim 10, wherein said channel displacement is less than approximately 0.10 microns.

13. The process of claim 12, wherein said channel displacement is in the range of approximately 0.03 to 0.05 microns.

* * * * *